United States Patent [19]

Mun

[11] Patent Number: 4,661,836
[45] Date of Patent: Apr. 28, 1987

[54] FABRICATING INTEGRATED CIRCUITS

[75] Inventor: Joseph Mun, Old Harlow, England

[73] Assignee: ITT Industries Inc., New York, N.Y.

[21] Appl. No.: 781,194

[22] Filed: Sep. 25, 1985

Related U.S. Application Data

[63] Continuation of Ser. No. 386,158, Jun. 7, 1982, abandoned.

[30] Foreign Application Priority Data

Jun. 25, 1981 [GB] United Kingdom ............... 8119677

[51] Int. Cl.[4] ............... H01L 23/36; H01L 23/12; H01L 25/04
[52] U.S. Cl. ............................. 257/81; 357/3; 357/75; 357/68; 357/51
[58] Field of Search ............ 357/81, 56, 3, 75, 68, 357/80, 51

[56] References Cited

U.S. PATENT DOCUMENTS

| | | | |
|---|---|---|---|
| 3,435,306 | 11/1966 | Martin | 357/3 |
| 3,509,428 | 10/1967 | Mankarious et al. | 357/56 |
| 3,696,272 | 10/1972 | Assour | 357/56 |
| 3,981,073 | 9/1976 | Dully | 357/3 |
| 4,091,408 | 5/1978 | Lee et al. | 357/81 |
| 4,097,890 | 6/1978 | Morris et al. | 357/68 |

FOREIGN PATENT DOCUMENTS 0123887  9/1979  Japan ........................ 357/81

Primary Examiner—Andrew J. James
Assistant Examiner—S. V. Clark
Attorney, Agent, or Firm—John T. O'Halloran; Robert P. Seitter

[57] ABSTRACT

A millimeter wave integrated circuit (MIC) includes both low power components and high power components, e.g. Gunn diodes, disposed on a common semi-insulating semi-conductor substrate. Each high power component is formed in an active epitaxial layer and is provided with a heat sink comprising a thermally conductive material deposited in an opening in the back of the substrate below the compound. The low power components are isolated by an implanted proton layer.

7 Claims, 2 Drawing Figures

CROSS SECTION OF MM WAVE
INTEGRATED CIRCUIT
(NOT TO SCALE)

CROSS SECTION OF MM WAVE
INTEGRATED CIRCUIT
(NOT TO SCALE)

4,661,836

FABRICATING INTEGRATED CIRCUITS

This application is a continuation of application Ser. No. 386,158, filed June 7, 1982 now abandoned.

BACKGROUND OF THE INVENTION

1. Field of the Invention

This invention relates to millimeter wave integrated circuits (MIC's) and to methods of fabricating such circuits.

2. Description of the Prior Art

Millimeter wave integrated circuits are generally low power devices which are limited to small signal processing applications. Attempts to provide high power integrated circuits, e.g. for use in high frequency transmission systems, wherein passive matching components and active power components such as Gunn diodes have so far proved unsuccessful. These active and passive components have widely conflicting requirements. Thus a Gunn diode structure typically involves the fabrication of an $n^+$-n-$n^+$ epitaxial layer on an $n^{++}$ gallium arsenide substrate whereas millimeter wave integrated circuits require a high resistivity semi-insulating substrate to provide the necessary isolation of the circuit. To reduce thermal impedance thereby preventing overheating of the diode, it is then necessary to reduce the thickness of the MIC substrate. If this is done, however, the strip line loss of the MIC increases to an unacceptable value and the whole device becomes extremely fragile.

SUMMARY OF THE INVENTION

The object of the present invention is to minimize or to overcome these disadvantages.

According to one aspect of the invention there is provided a millimeter wave integrated circuit including low power and high power components disposed on a common semiconductor substrate, and wherein each said high power component is provided with a heat sink comprising a body of thermally conductive material disposed in an opening in the substrate below and in register with the high power component.

According to another aspect of the invention there is provided a method of fabricating a millimeter wave integrated circuit incorporating both low power and high power components disposed on a common semiconductor substrate, the method including removing a portion of the substrate below and in register with each said power component and filling the opening thus formed with a thermally conductive material thereby providing a pathway for heat dissipated by the component.

A preferred structure consists of a $n^+$-n-$n^+$ GaAs Gunn diode disposed on a short column of plated gold integral heat sink in a hole etched through the semi-insulating substrate. The thin conductive layer surrounding the Gunn diode is rendered high resistance by proton isolation for the fabrication of rf circuits.

DESCRIPTION OF THE INVENTION

Figure 1:
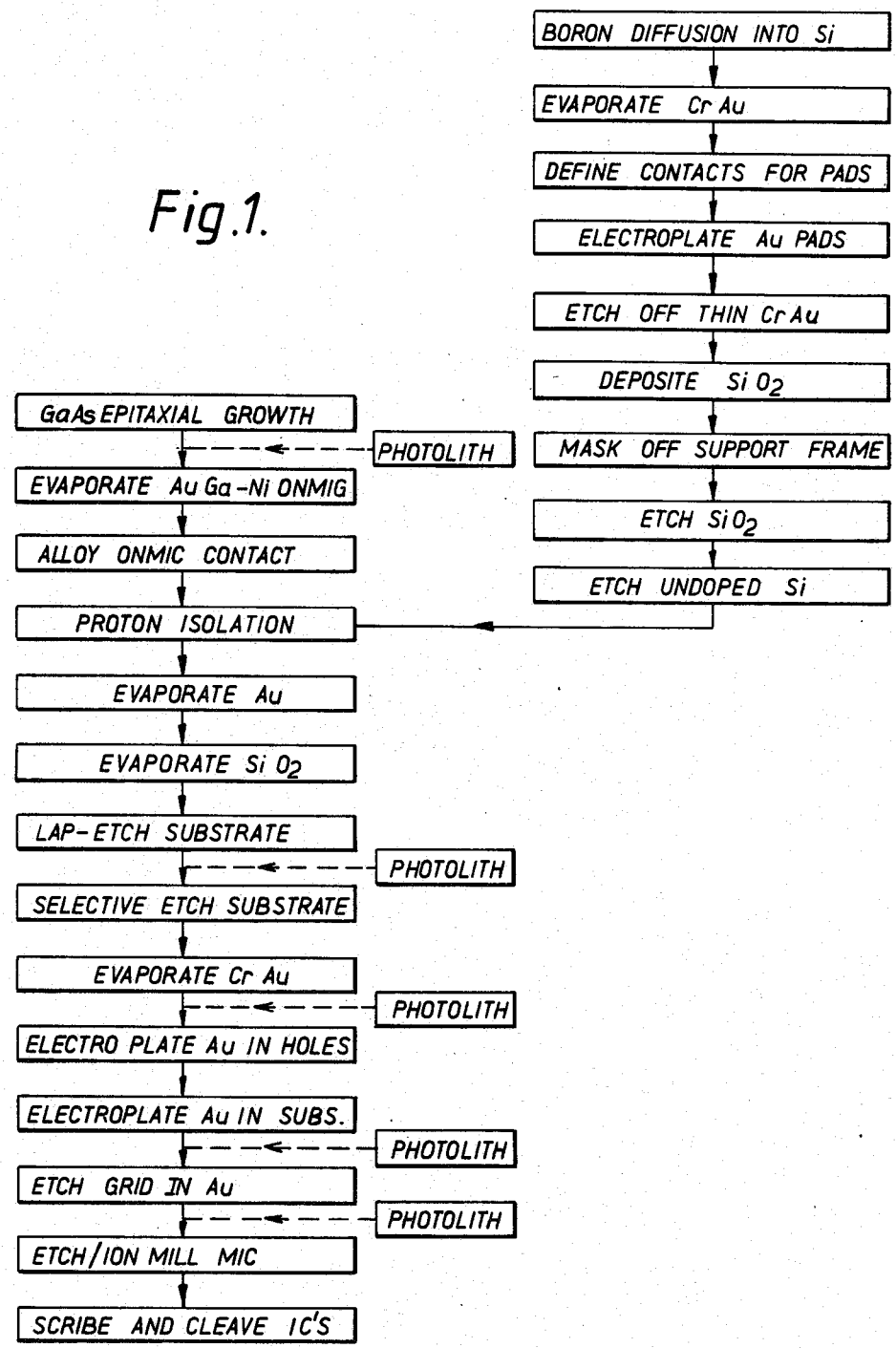
FIG. 1 is a flow chart of the integrated circuit fabrication process.
Figure 2:
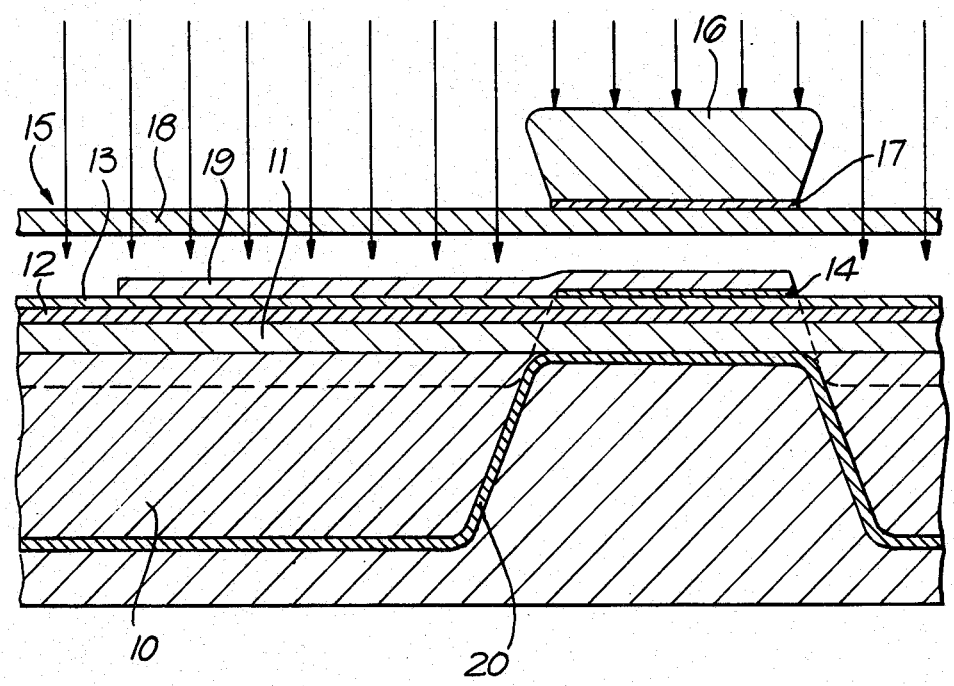
FIG. 2 is a cross-sectional view of a circuit device produced by the process of FIG. 1.

Referring to the drawings, the fabrication process is conveniently divided into a number of stages.

The first stage comprises the growth of an epitaxial $n^+$-n-$n^+$ sandwich Gunn layer on a semi-insulating substrate 10. The Gunn layer consists of an approximately 5 μm, $>10^{18}$/cc buffer layer 11 followed by a 2 μm (60 GHz), mid $10^{15}$/cc active layer 12 and an approximately 3 μm, $>10^{18}$/cc top contact layer 13. The thickness of the active layer 12 is of course determined by the frequency at which the diode is to operate.

An ohmic contact 14 consisting of AuGe-Ni (2000 Å-500 Å) is evaporated onto the $n^+$ top surface. The area of the contact, typically 0.004" to 0.005" in diameter, is defined e.g. by a metal lift-off process. Alignment marks may also be formed on the slice at this stage of the process. The contact 14 is then alloyed into the GaAs in the usual manner.

A reusable proton isolation mask 15 is aligned over the top surface of the slice and the whole of $n^+$-n-$n^+$ sandwich surrounding the Gunn diodes is proton isolated. The reason for employing a reusable proton isolation mask instead of electroplating thick gold pads over the AuGe-Ni contacts is that thick gold pads ($>10$ μm) may interfere with subsequent contact mask alignments. The mask may comprise a 25 μm thick silicon wafer with boron diffused into one surface approximately 4 μm in depth. An electroplated gold pad 16 corresponding to the diameter and the position of Gunn diode is formed on a thin metal, e.g. CrAu, layer 17 deposited on the boron diffused surface. The thickness of the gold pads depends on the maximum proton energy required to penetrate the $n^+$-n-$n^+$ sandwich layer. The final and most critical step is to selectively etch off the 20 μm or so undoped silicon, leaving a membrane 18 of typically 4 μm thick boron doped silicon which is relatively transparent to protons. For rigidity of the membrane, an unetched frame (not shown) is left on the wafer for support. In some applications the proton isolation mask may be dispensed with and projection lithographic technique employed.

After proton isolation, a thick layer 19 of gold (e.g. 1 μm) is evaporated over the top surface followed by a protective layer (not shown) of similar thickness of electron beam deposited SiO$_2$. The gold layer will eventually form a millimeter wave integrated circuit on GaAs and the function of low temperature SiO$_2$ coating is for anti-scratching of Au surface and to hold the Au down for subsequent processing.

The top surface of the slice is mounted on an appropriate holder (not shown) and the semi-insulating substrate is chemically lap-etched to between 0.003" to 0.005" thick (75 μm to 125 μm). In this case a compromise is required, say 0.004". The thinner the substrate, the better is the heat sink, but too thin a substrate will increase strip line loss and makes the final IC chip too fragile to handle (estimated to be at least 1 mm×2 mm in area).

Photo resist is spun on to the substrate side and a hole in the resist corresponding to the size and the position of each Gunn diode on top is opened. The slice is then used as the cathode of an electrolytic etch to selectively remove semi-insulating GaAs under the Gunn diode. The bias to the slice is applied to gold layer 19. The gold layer and a connecting gold wire for bias application is isolated from the electrolyte by suitable masking material and only the semi-insulating surface is exposed to the etch. For etch to occur, electrons from the surface of GaAs are removed thereby destroying the bonds which link the atoms of the semi-conductor. However, when the current from an external power supply is available to meet the demand for electrons, the chemical action of the etchant is inhibited. In our case, bias is applied from the top ohmic contact through the Gunn diode. Initially, no current can flow through the semi-insulating substrate and etch of the semi-insulating GaAs will proceed until the electrolyte meets the n+ buffer layer. Current wil then flow and the etch at the n+ buffer layer is inhibited, resulting in a self-limting effect. The lateral spreading of the hole 20 will depend on how long the slice is left in the etch once the buffer layer is reached.

The resist layer is removed and metal, e.g. CrAu is evaporated onto the semi-insulating substrate side. For good metal coverage of walls in the hole, a rotary slice holder is preferred to rotate and tilt the slice during evaporation. The operation of the Gunn diode will be in series with a forward bias Schottky barrier contact which means a negative bias is required on the top contact, assuming that the substrate side is grounded. An alternative is to use deuterium or a higher dosage proton implant for isolation which is capable of maintaining the isolated layer high resistance up to 550° C. In which case, AuGe-Ni instead of CrAu can be used to form ohmic contact.

Each hole is then filled with electroplated gold forming a gold heat sink column to the Gunn diode. A two stage plating may be necessary, to fill each hold first, then plate up the substrate side for bonding.

After etching away the SiO$_2$ protective layer, the MIC circuit is then defined on top of the slice by conventional photolith methods by either etching, or preferably ion milling, off the unwanted gold to form rf circuits.

Grids are then etched through plated gold, on the under side of the slice, for scribing and cleaving the slice into integrated circuit chips.

Whilst the foregoing description relates primarily to devices formed in gallium arsenide it will be clear that the fabrication techniques are not limited to that material but can also be extended to other semiconductors.

What is claimed is:

1. A millimeter wave integrated circuit comprising:
a semi-insulating substrate having a thickness of between 75 to 125 micrometers, said substrate having a semiconductor layer on one surface, a plurality of components formed in said semiconductor layer, one of said components being a high power component, said substrate being formed with openings in registery with said high power component, and a body of thermally conductive material disposed in said opening.

2. An integrated circuit as claimed in claim 1, wherein the substrate material is gallium arsenide.

3. An integrated circuit as claimed in claim 1, wherein said high power component is a Gunn diode.

4. An integrated circuit as claimed in claim 1, wherein said high powered component is isolated from other active components by a proton isolated boundary.

5. An integrated circuit in accordance with claim 1, wherein said semiconductor layer is about 10 micrometers thick.

6. An integrated circuit as claimed in claim 3, wherein said Gunn diode comprises an epitaxially grown n+-n-n+ sandwich.

7. An integrated circuit as claimed in claim 3, wherein said Gunn didoe comprises a buffer layer, active layer and top contact layer of approximately 10 micrometers total thickness disposed on said substrate.

* * * * *